United States Patent [19]

Side et al.

[11] Patent Number: 4,724,635
[45] Date of Patent: Feb. 16, 1988

[54] ELECTROMAGNETIC SEALING DEVICE OF THE KNIFE SEAL TYPE

[75] Inventors: Solly Side, Arnouville; Jean Pierre Magnat, Epinay; Guy Bellot, Conflans Ste Honorine, all of France

[73] Assignee: Thomson-CSF, Paris, France

[21] Appl. No.: 67,438

[22] Filed: Jun. 29, 1987

Related U.S. Application Data

[63] Continuation of Ser. No. 852,423, Apr. 16, 1986, abandoned.

[30] Foreign Application Priority Data

Apr. 18, 1985 [FR] France .................................. 85 05877

[51] Int. Cl.⁴ .............................................. E06B 7/22
[52] U.S. Cl. ......................................... 49/483; 49/489; 174/35 MS
[58] Field of Search .......................... 49/483, 489, 488; 174/35 MS, 35 GC

[56] References Cited

U.S. PATENT DOCUMENTS 1,701,969 2/1929 Brazell ............................... 49/489 X
3,589,070 6/1971 Hansen ................................. 49/483

FOREIGN PATENT DOCUMENTS 909009 10/1962 United Kingdom .................. 49/483

*Primary Examiner*—Philip C. Kannan
*Attorney, Agent, or Firm*—Cushman, Darby & Cushman

[57] ABSTRACT

An electromagnetic sealing device comprising a flexible seal easy to replace. This device comprises on the one hand a support in the form of a trench, in which a resilient seal in the form of a channel, is disposed by simple snap fitting of its edges into two longitudinal stops of the support and, on the other hand, a knife which, by penetrating into the channel formed by the seal, compresses this latter in the space left free between the support and the knife.

4 Claims, 6 Drawing Figures

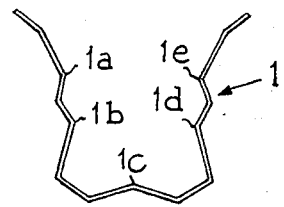
Fig.1
Fig.2a 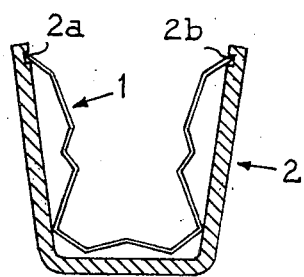 Fig.2b 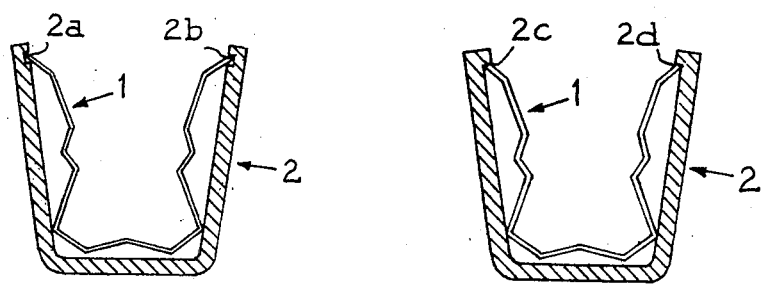
Fig.3
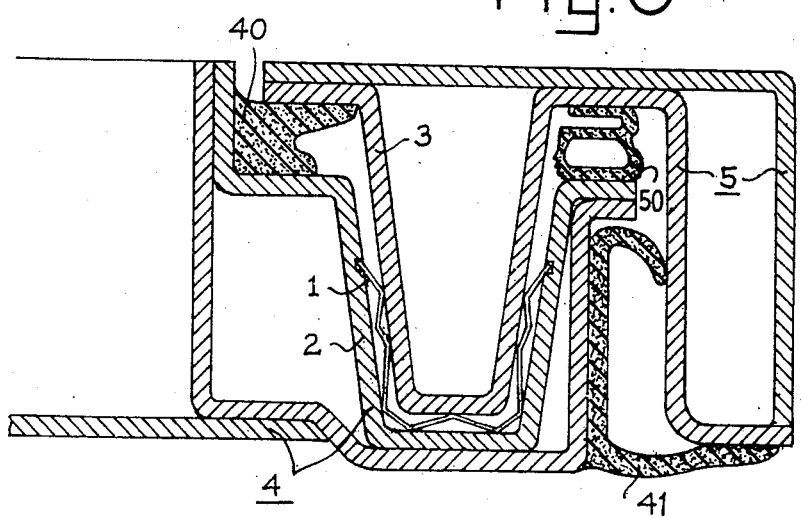

ELECTROMAGNETIC SEALING DEVICE OF THE KNIFE SEAL TYPE

This is a continuation of application Ser. No. 852,423, filed Apr. 16, 1986, which was abandoned upon the filing hereof.

BACKGROUND OF THE INVENTION

The present invention relates to a sealing device for enclosures of the Faraday cage type. This device, of the knife seal type, serves for sealing, against electromagnetic waves and electric currents, the junction between two parts one of which comprises an orifice and the other of which comprises a panel for closing the orifice. For this purpose, a sort of metal knife, also called saber, integral with one of the parts is intended to come into contact with a flexible metal seal, integral with the other part, along a closed line which surrounds the opening.

It is known in the prior art to use as a seal a flexible rubber rod surrounded by a metal, tubular and knitted sheath. This seal is fixed to one of the two metal parts and is crushed or nipped between the two parts because of the knife and, through its sheath, ensures the electric contact between the two parts. Known devices comprising such seals have drawbacks in that fixing the seal, generally by bonding, is a delicate process which is tiresome if it must be changed since the knitted metal sheath is fragile and does not withstand well, at the position of contact with the knife, the repeated operations for opening and closing the orifice. Furthermore, radioelectric sealing at very high frequencies is mediocre.

Prior art devices also use as a seal so called American seals which are like combs cut out from metal sheets and whose wide teeth have, in the cross section of the comb, considerable curvature. This curvature provides the resilience of the teeth of the comb when the knife comes into contact while bearing perpendicularly to the plane of the comb, either by its edge in a movement perpendicular to the plane of the comb, or by one of its faces in a movement parallel to the plane of the comb. Known devices, which comprise these seals, have drawbacks in that the teeth of the comb are fragile and break, and replacement of the comb, which is generally screwed is a relatively long process.

It is also known to use seals formed of two strips bent along longitudinal bends. These seals are held in position by a sort of clip on the two opposite edges of a trench inside which a knife penetrates. Such an assembly is expensive because of its relative mechanical complexity.

SUMMARY OF THE INVENTION

The aim of the present invention is to avoid or at least reduce the above-mentioned difficulties.

This is obtained with a U shaped seal disposed in a support of the gutter kind, with a knife which penetrates into the gutter while bearing on the bottom and on the side walls of the seal.

According to the present invention, there is provided an electromagnetic sealing device of the knife seal type, comprising: a seal formed by a metal strip bent so as to form a channel, the bent strip having n longitudinal bulges (n being a positive integer), with convexity turned inwardly of the channel; a support forming a trench having two longitudinal stops disposed on the internal wall of the trench respectively in the vicinity of the two edges of this trench, the strip being disposed inside the trench and being held therein by its two longitudinal edges bearing respectively against the two stops; and a knife intended to penetrate in the channel and bear on the bulges.

BRIEF DESCRIPTION OF THE DRAWINGS

The present invention will be better understood and other characteristics will be clear from the following description with reference to the accompanying FIGS. which show:

FIG. 1, a seal for a sealing device of the invention,

FIGS. 2a and 2b, the seal of FIG. 1 disposed respectively in a first and a second support, FIG. 3, a sealing device of the invention, and FIGS. 4 and 5 views relative to the association of two sealing elements of a sealing device in accordance with the invention.

In the different Figures, the corresponding elements are designated by the same reference numerals.

DETAILED DESCRIPTION OF THE PREFERRED EMBODIMENT

Figure 4:
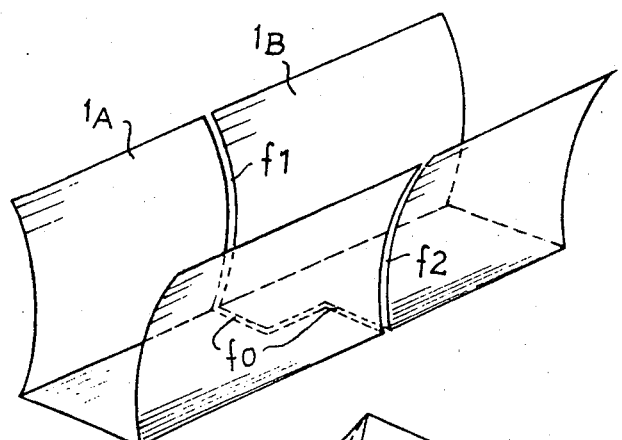

FIG. 1 shows in a cross sectional view a seal 1 for an electromagnetic sealing device of the knife seal type. It is a metal part in the form of a channel, formed by longitudinally bending a metal strip 88 mm wide and 0.2 mm thick made from a copper and iron alloy with 2.3% iron and performing an annealing treatment on this joint for flexibility and hardness. The bottom and the side walls of the channel have, in all, five bulges turned towards the inside of the channel: 1c for the bottom, 1a, 1b for one of the walls, 1d, 1e for the other wall.

FIG. 2a shows, still seen in cross section, the seal 1 of FIG. 1 after it has been placed in a support 2. This support forms a sort of trench whose cross section is substantially that of a trough and whose side walls are each formed with a longitudinal groove 2a and 2b situated near the top of the wall. Seal 1 is fitted into support 2 so that the bottom of the channel rests in the vicinity of the bottom of the trench. When seal 2 is not subjected to any stress, because the spacing between the edges of the strip which form it is about 40 mm, i.e. greater by several millimeters than the space which is reserved for it between the facing walls of support 2, it is necessary to press its edges together for introducing it into its support. This is possible because of the resilience of seal 1. The edges, snap fitted respectively in grooves 2a and 2b, which form stops, so as to lock the seal in its support 2. To remove seal 1 from its support 2, it is then necessary to grip it at one of its ends and to press together its facing walls.

FIG. 2b is a cross sectional view illustrating a second embodiment of the sealing device of the invention. FIG. 2b is distinguished from FIG. 2a only by the fact that support 2 has, for retaining seal 1, not two longitudinal stops of the groove type but two longitudinal stops of the flange type 2c and 2d. These stops 2c and 2d are, in the example shown, obtained by machining support 2 before it is bent to form its trough section; however, it is also possible to obtain stops of the flange type by bending.

FIG. 3 is a partial sectional view of an enclosure of the Faraday cage type comprising the assembly formed by seal 1 and support 2 which were described with reference to FIGS. 1 and 2a. Seal 1 and support 2 are two of the elements of a door 4, which is also fitted with rubber seals 40, 41. FIG. 3 also shows a part of the fixed frame 5 of the door. This fixed frame is provided with a knife 3 and rubber seal 50 intended to cooperate with seals 40 and 41 for making the connection between door 4 and frame 5 water and dust tight. In the representation given in FIG. 3, the door is closed so that knife 3 has penetrated into seal 1. By comparison with FIG. 2a it should be noted that penetration of knife 3 into the channel formed by seal 1, by bearing first of all on bulges 1a, 1e (see FIG. 1), then on 1b, 1d and then on 1c results in forcing the seal against the walls of the space remaining free between support 2 and knife 3. FIG. 3 shows that there is contact at eleven places between seal 1 and the walls which surround it: contact with knife 3 at the point of the five bulges and contact with support 2 at six places (including those with the edges of a strip which forms seal 1).

Figure 5:
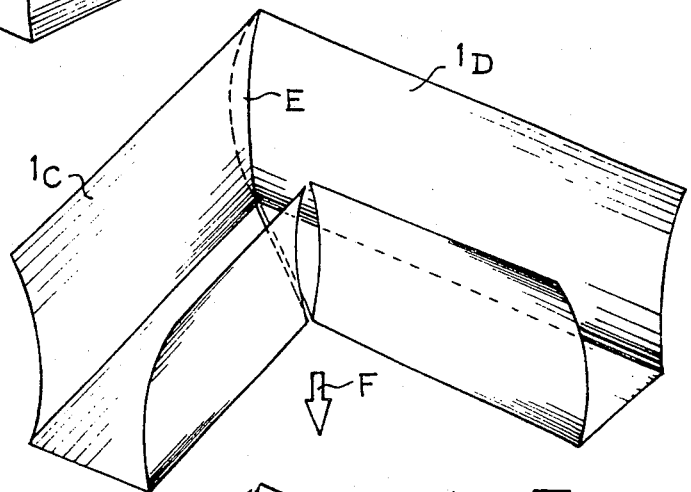
Figure 5:
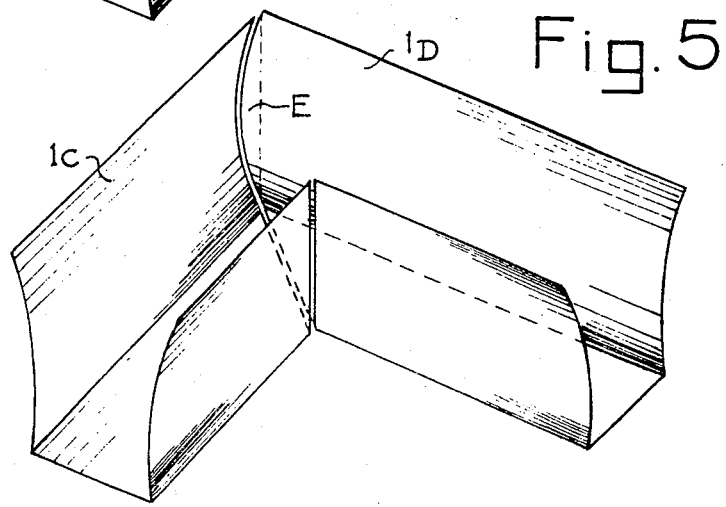

FIGS. 4 and 5 show how seals for sealing devices of the invention may be juxtaposed. They are here seals slightly different from the one described with reference to FIGS. 1 to 3, to the extent that, while still having the shape of a channel, they do not comprise the five bulges 1a to 1e shown in FIG. 1 but only two bulges formed by convex side walls with their convexity turned inwardly of the channel. Nevertheless the seals which are shown in FIGS. 4 and 5 are, in the examples described, intended to be seals interchangeable with those shown in FIGS. 1 to 3.

FIG. 4 shows two seals 1A, 1B placed end to end in a support whose section is that of support 2 of FIGS. 2a and 3. These seals are in the position which they occupy before penetration of a knife. For better showing the way in which the connection is obtained, only the seals are shown. The two seals may be considered as a single seal whose vertical walls and bottom have been cut respectively by vertical slits f1, f2. To prevent electromagnetic leaks at the level of the connection, slits f1 and f2 are not disposed face to face but are staggered with respect to each other because the bottom of the seal is cut by a zig zag slit f0.

FIG. 5 shows two seals 1C, 1D in the position which they occupy before and after introduction in each of them of a knife of the type shown in FIG. 3. An arrow F goes from the position before introduction of the knives to the position after introduction of the knives. These positions will be called, respectively, the "before" position and the "after" position. As in the case of FIG. 4, only the seals have been shown. These seals are disposed at right angles to each other, thus forming a channel bent at right angles.

In the "before" position, the walls of the salient angle (seen from inside the channel) are cut so that the wall of seal 1E assumes, at its end corresponding to the angle, substantially the curvature of the wall of seal 1D, whereas the wall of the seal does not stop at the end of seal 1C but extends slightly therebeyond, by a surface E, so as to reduce as much as possible the slit between the walls 1C and 1D in the "after" position.

In the "before" position, as in the "after" position, cuts at 45° with respect to the longitudinal directions, not shown, of each of the seals provides a parallel edge connection.

As far as the walls of the re-entrant angel are concerned (seen from inside the channel), the ends of the walls of seals 1C, 1D which end there are cut so that in the "after" position these ends are substantially parallel.

The invention is not limited to the examples described, but it applies in particular to any sealing device of the knife seal type in which the seal has the shape of a channel and comprises at least one longitudinal bulge with its convexity turned inwardly of the channel, in which a support in the form of a trench with longitudinal stops holds the seal in which a knife, penetrating into the channel, bears on the bulges and thus compresses the seal in the space left free between the support and the knife.

What is claimed is:

1. An electromagnetic sealing device of the knife seal type, comprising:
    a seal formed by a metal strip bent so as to form a channel, the bent strip having two longitudinal edges and n longitudinal bulges (n being a positive integer) with convexity turned inwardly of the channel; and
    a support forming a trench having two longitudinal stops respectively disposed on either side of the internal wall of the trench in the vicinity of the top edges of the two longitudinal side walls of the trench, the metal strip being disposed inside the trench and being held therein by the two longitudinal edges of the strip, said two longitudinal edges being turned outwardly from the channel so as to maintain said strip in the trench by bearing respectively on the two stops, wherein a knife may penetrate into the channel and bear on the bulges.

2. A device as claimed in claim 1, wherein said channel has a trough shaped section and comprises a bottom portion which contains one of the bulges and side walls which each have at least one of the bulges.

3. A device as claimed in claim 1, wherein said stops are grooves and said strip is held in position by snap fitting in the grooves.

4. A device as claimed in claim 1, wherein said stops are flanges.

* * * * *